United States Patent [19]
Morimoto et al.

[11] Patent Number: 4,878,223
[45] Date of Patent: Oct. 31, 1989

[54] SEMICONDUCTOR LASER ARRAY DEVICE

[75] Inventors: Taiji Morimoto, Nara; Hiroyuki Hosoba, Tenri; Mitsuhiro Matsumoto, Nara; Mototaka Taneya, Tsukuba; Sadayoshi Matsui, Tenri, all of Japan

[73] Assignee: Sharp Kabushiki Kaisha, Japan

[21] Appl. No.: 224,558

[22] Filed: Jul. 26, 1988

[30] Foreign Application Priority Data

Jul. 28, 1987 [JP] Japan .................. 62-188279

[51] Int. Cl.$^4$ .................................. H01S 3/19
[52] U.S. Cl. .......................... 372/50; 372/46; 372/48; 372/97
[58] Field of Search ............ 372/45, 46, 50, 97, 372/48

[56] References Cited

U.S. PATENT DOCUMENTS 4,751,709  6/1988  Matsumoto et al. .............. 372/46

FOREIGN PATENT DOCUMENTS 0245191 12/1985 Japan ........................... 372/50

OTHER PUBLICATIONS

Matsumoto et al., (1985), J. Appl. Phys., 58(7):2783-2785.

Primary Examiner—William L. Sikes
Assistant Examiner—Georgia Y. Epps
Attorney, Agent, or Firm—Irell & Manella

[57] ABSTRACT

A semiconductor laser array device comprising a substrate with a plurality of grooves and an active layer disposed over the substrate, resulting in optical waveguides within the active layer corresponding to the grooves, wherein the grooves are disposed over the entire area of the substrate and a means for preventing the injection of current into some of the grooves that are positioned outside of the central area of the substrate is disposed whereby the other grooves positioned in the central area of the substrate constitute a laser array portion of the semiconductor laser array device.

3 Claims, 5 Drawing Sheets

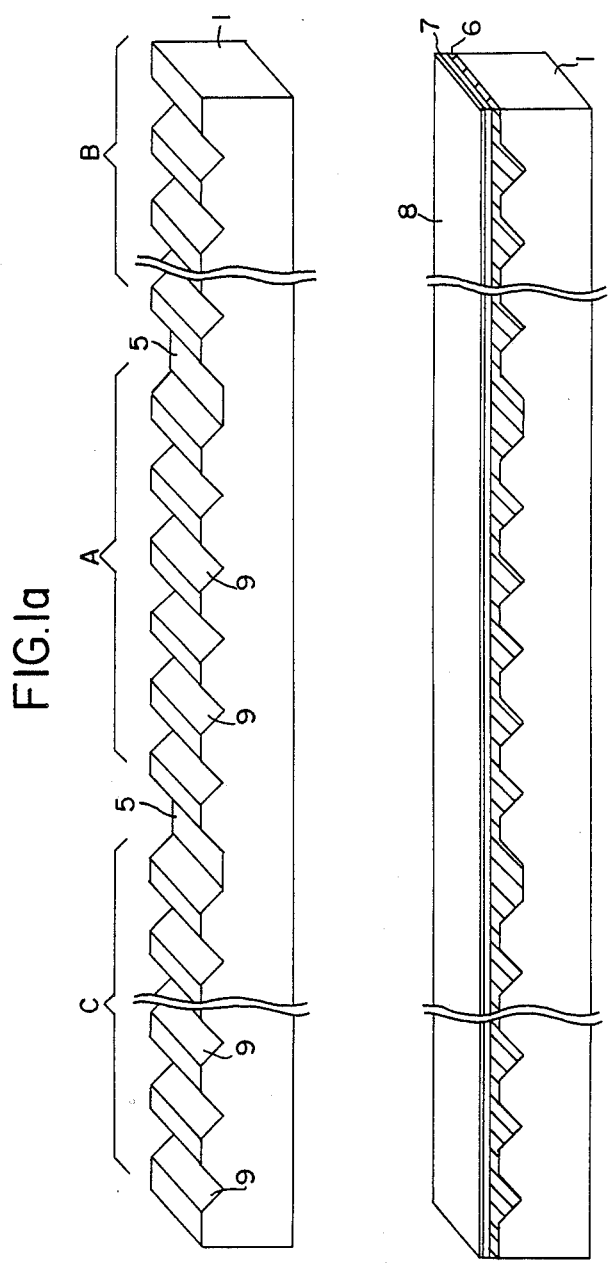

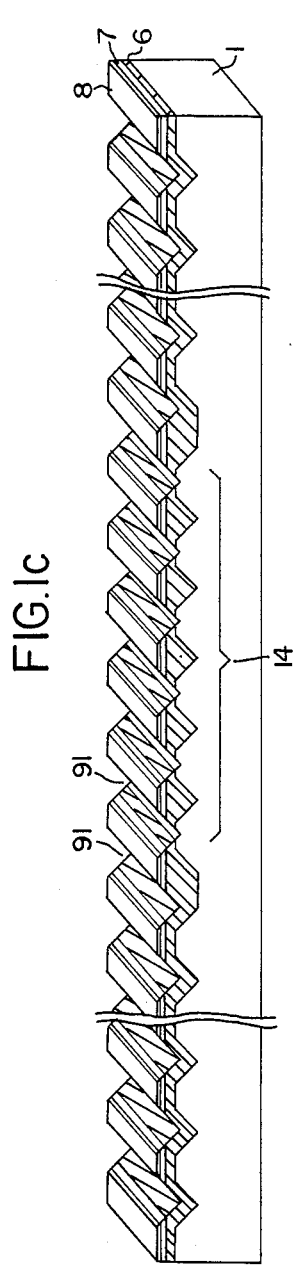
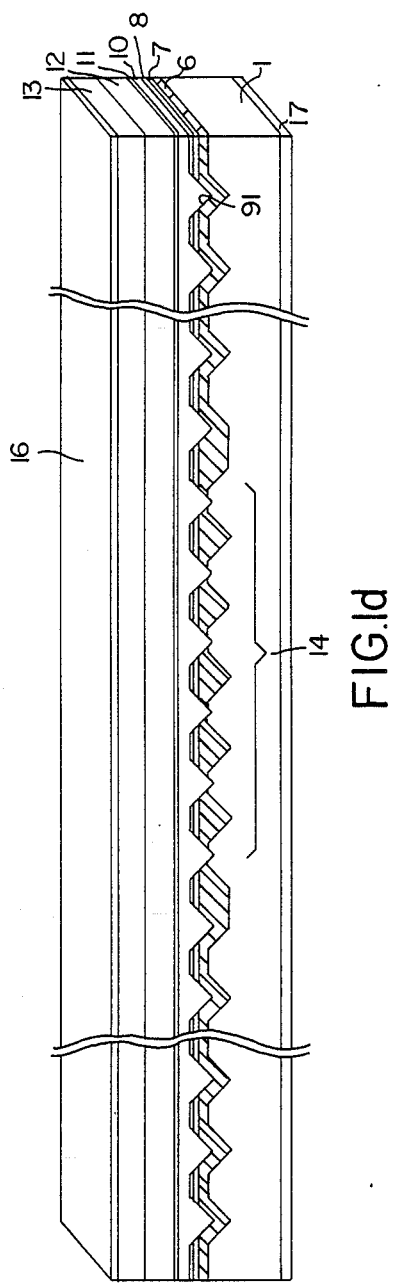
FIG.1c
FIG.1d

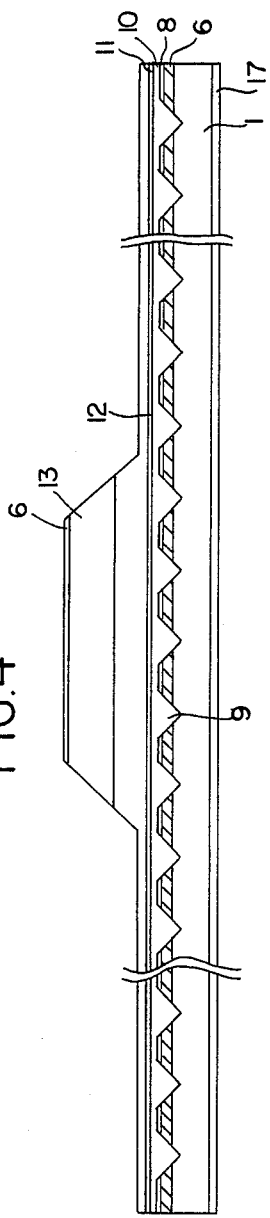
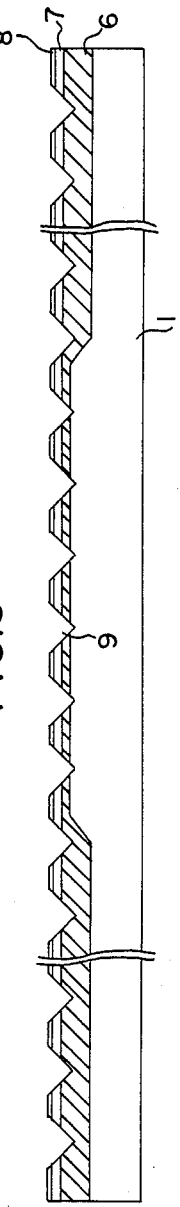

SEMICONDUCTOR LASER ARRAY DEVICE

BACKGROUND OF THE INVENTION

1. Field of the invention:

This invention relates to a semiconductor laser array device with stabilized operation characteristics.

2. Description of the prior art:

With the advance of semiconductor laser devices that produce high output power, more attention has been paid to semiconductor laser array devices. For the production of semiconductor laser array devices, there are mainly three crystal growth methods, molecular beam epitaxy (MBE), metal-organic chemical vapor deposition (MOCVD), and liquid phase epitaxy (LPE). A semiconductor laser array device that is produced by LPE has been proposed by Matsumoto; Journal of Applied Physics, vol. 58(7), P 2783-2785 (1985) in which a V-channeled substrate inner stripe (VSIS) structure with three waveguides is disclosed. FIGS. 16A to 16C show the production process of a semiconductor laser array device with ten waveguides. On a p-GaAs substrate 301, an n-$Al_{0.1}Ga_{0.9}As$ current blocking layer 302 with a thickness of 0.7 $\mu$m and an n-GaAs protective film 303 with a thickness of 0.1 $\mu$m are successively formed by LPE (FIG. 16A). Then, ten grooves 320 with a width of 4 $\mu$m each, a depth of 0.9 $\mu$m each and a pitch of 5 $\mu$m are formed by a photolithographic technique and an etching technique in such a way that they reach the substrate 301 through both the current blocking layer 302 and the protective layer 303 (FIG. 16B). Then, on the protective layer 303 including the grooves 320, a p-$Al_{0.4}Ga_{0.6}As$ cladding layer 304 having a thickness of 0.3 $\mu$m in the areas over the protective layer 303, an $Al_{0.1}Ga_{0.9}As$ active layer 305 with a thickness of 0.08 $\mu$m, an n-$Al_{0.4}Ga_{0.6}As$ cladding layer 306 with a thickness of 1.2 $\mu$m, and an n-GaAs contact layer 307 having a thickness of 1.5 $\mu$m are successively formed by LPE (FIG. 16C). The semiconductor laser array device produced in this way is disadvantageous in that the grooves 320 are not completely filled with the p-cladding layer 304, resulting in a bend of the active layer 305, which causes a weakness of the optical-coupling between the adjacent waveguides. Thus, laser oscillation occurs in the individual waveguide, which causes difficulties in attaining laser oscillation in a synchronous phase mode.

SUMMARY OF THE INVENTION

The semiconductor laser array device of this invention, which overcomes the above-discussed and numerous other disadvantages and deficiencies of the prior art, comprises a substrate with a plurality of grooves and an active layer disposed over said substrate resulting in optical waveguides within said active layer corresponding to said grooves, wherein said grooves are disposed over the entire area of said substrate and a means for preventing the injection of current into some of said grooves that are positioned outside of the central area of said substrate is disposed whereby the other grooves positioned in the central area of said substrate constitute a laser array portion of said semiconductor laser array device.

In a preferred embodiment, the grooves are disposed with a certain pitch in the waveguiding direction of laser beams.

In a preferred embodiment, at least one groove is disposed on each side of the grooves for constituting a laser array portion positioned on the central area of said substrate.

In a preferred embodiment, the grooves that are positioned outside of the central area of said substrate are disposed at a certain angle to the waveguiding direction of laser beams.

In a preferred embodiment, the substrate has a mesa in the central area thereof and a current blocking layer is disposed outside of said mesa, whereby the injection of current into the grooves that are positioned outside of said mesa is prevented.

In a preferred embodiment, the means for preventing the injection of current into the grooves positioned outside of the central area of said substrate is constituted by a buried structure composed of burying layers, a ridge guide structure composed of an insulating film, or a high-resistive structure composed of a proton-injected layer.

In a preferred embodiment, an impurity is diffused into the portions of the semiconductor layers that are positioned over the central area of said substrate whereby the injection of current into the grooves that are positioned outside of the central area of said substrate is prevented.

Thus, the invention describes herein makes possible the objectives of (1) providing a semiconductor laser array device with stabilized operation characteristics that has a flat and uniform active layer regardless of the number of waveguides; (2) providing a semiconductor laser array device with a flat and uniform active layer that attains laser oscillation in a synchronous phase mode; and (3) providing a method for the production of a semiconductor laser array device with a flat and uniform active layer by which the semiconductor laser array device is produced with reproducibility with a high yield.

BRIEF DESCRIPTION OF THE DRAWINGS

This invention may be better understood and its numerous objects and advantages will become apparent to those skilled in the art by reference to the accompanying drawings as follows:

FIG. 1 is a sectional view showing a semiconductor laser array device of this invention.

FIG. 4 is a sectional view showing another semiconductor laser array device of this invention.

FIG. 5A is a sectional view showing another semiconductor laser array device of this invention.

FIG. 5B is a plane view showing an arrangement of the grooves shown in FIG. 5A.

FIGS. 7A to 7D are diagrams showing another production process of the semiconductor laser array device shown in FIG. 1.

FIG. 8A is a sectional view showing another semiconductor laser array device of this invention.

FIG. 8B is a plane view showing an arrangement of the grooves formed on the substrate of the semiconductor laser array device shown in FIG. 8A.

FIG. 9A is a sectional view showing another semiconductor laser array device of this invention.

FIG. 9B is a plane view showing an arrangement of the grooves formed on the substrate of the semiconductor laser array device shown in FIG. 9A.

FIG. 9C is a plane view showing another arrangement of the grooves of the semiconductor laser array device of FIG. 9A.

FIG. 10A is a sectional view showing another semiconductor laser array device of this invention.

FIG. 10B is a plane view showing an arrangement of the grooves formed on the substrate of the semiconductor laser array device shown in FIG. 10A.

FIG. 10C is a plane view showing another arrangement of the grooves of the semiconductor laser array device of FIG. 10A.

FIG. 11 is a sectional view showing another semiconductor laser array device of this invention.

FIGS. 12A and 12B are a diagram showing the production process of another semiconductor laser array device of this invention.

FIGS. 13A to 13C are a diagram showing the production process of another semiconductor laser array device of this invention.

FIG. 14A is a sectional view showing another semiconductor laser array device of this invention.

FIG. 14B is a sectional view showing another semiconductor laser array device of this invention.

FIG. 14C is a sectional view showing another semiconductor laser array device of this invention.

FIGS. 15A to 15C, respectively, are plane views showing other arrangements of the grooves formed on the substrate of the semiconductor laser array device shown in FIG. 13C.

FIGS. 16A to 16C are a diagram showing the production process of a conventional semiconductor laser array device.

DESCRIPTION OF THE PREFERRED EMBODIMENTS

Example 1

Figure 2:
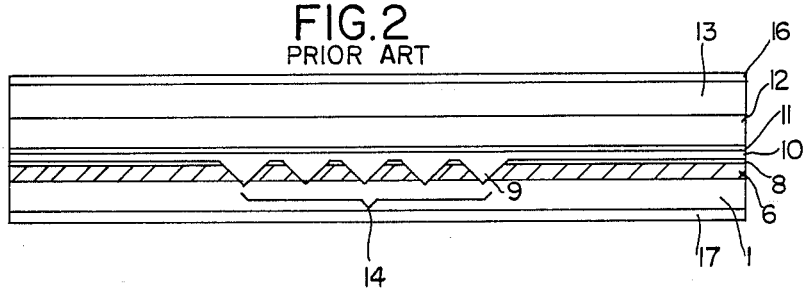
FIG. 2 is a sectional view showing another semiconductor laser array device of this invention.

FIG. 1 shows a semiconductor laser array device of this invention, which comprises a p-GaAs substrate with a mesa 1a in the central portion thereof and an n-GaAs first current blocking layer 10 disposed on both sides of the mesa 1a. On both the mesa 1a and the n-GaAs first current blocking layer 10, an n-$Al_{0.1}Ga_{0.9}As$ second current blocking layer 2, an n-GaAs protective layer 3, a p-$Al_{0.4}Ga_{0.6}As$ cladding layer 4, an $Al_{0.1}Ga_{0.9}As$ active layer 5, an n-$Al_{0.4}Ga_{0.6}As$ cladding layer 6, and an n-GaAs contact layer 7 are successively disposed. A plurality of grooves 8 exist in such a manner that they reach the p-GaAs substrate 1 through the n-AlGaAs second current blocking layer 2. The grooves 8 positioned in the n-GaAs first current blocking layer 10 do not reach the p-GaAs substrate 1. Accordingly, current is injected into the active layer 5 through the grooves 8 in the area of the mesa 1a, but the injection of current into the active layer 5 is prevented in the area on both sides of the mesa 1a by the n-GaAs first current blocking layer 10.

In this way, the semiconductor laser array device mentioned above is provided with the grooves 8 over the substantially entire area of the substrate 1, resulting in a flat and uniform active layer 5, which allows an occurrence of synchronous phase-coupling between the adjacent waveguides in the active layer 5. Thus, this semiconductor laser array device can attain stabilized operation characteristics.

Figure 6:
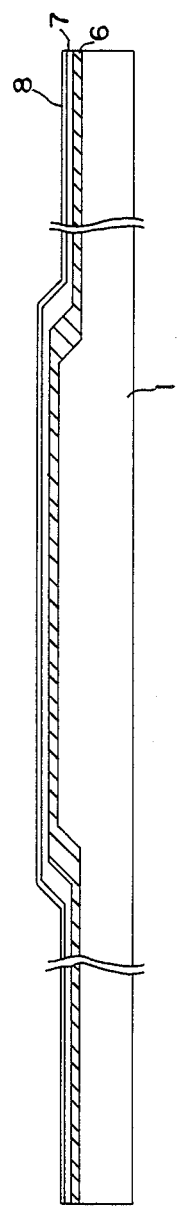
FIGS. 6A to 6F are diagrams showing a production process of the semiconductor laser array device shown in FIG. 1.

FIGS. 6A to 6F show a production process of the above-mentioned semiconductor laser array device. As shown in FIG. 6A, the mesa 1a with a width of 40 μm and a height of 1.0–2.0 μm is formed on the p-GaAs substrate 1 by an etching technique. Then, as shown in FIG. 6B, the n-GaAs first current blocking layer 10 is formed on the p-GaAs substrate 1 in a manner to make the top surface thereof flat. Then, as shown in FIG. 6C, the entire surface area of the n-GaAs first current blocking layer 10 is etched so as to remove the portion of the n-GaAs first current blocking layer 10 positioned over the mesa 1a, so that the surface of the remaining current blocking layer 10 becomes flush with the surface of the mesa 1a. The thickness of the remaining current blocking layer 10 is 1.0 μm.

Then, as shown in FIG. 6D, on both the n-GaAs substrate 1 and the n-GaAs current blocking layer 10, the n-$Al_{0.1}Ga_{0.9}As$ second current blocking layer 2 with a thickness of 0.7 μm and the n-GaAs protective layer 3 with a thickness of 0.1 μm are successively formed. Then, as shown in FIG. 6B, the grooves 8 with a width of 4 μm each, a depth of 1.0 μm each and a pitch of 5 μm are formed in the substrate 1 by a photolithographic technique and an etching technique in such a manner that the grooves positioned in the mesa 1a reach the substrate 1 through both the protective layers 3 and the current blocking layer 2, resulting in a grating with a pitch of 5 μm on the entire surface of the substrate 1. The pitch is set so that optical-coupling between adjacent waveguides in the active layer 5 can be achieved.

Then, as shown in FIG. 6F, on the protective layer 3 including the grooves 8, the p-$Al_{0.4}Ga_{0.6}As$ cladding layer 4 having a thickness of 0.25 μm on the protective layer 3, the $Al_{0.1}Ga_{0.9}As$ active layer 5 with a thickness of 0.08 μm, the n-$Al_{0.4}Ga_{0.6}As$ cladding layer 6 with a thickness of 1.2 μm and the n-GaAs contact layer 7 with a thickness of 1.5 μm are successively formed by LPE. Since the second current blocking layer 2 is made of $Al_{0.1}Ga_{0.9}As$, it does not undergo meltback during the LPE growth process.

Since this semiconductor laser array device has the grooves 8 formed over the entire area of the substrate 1, the p-$Al_{0.4}Ga_{0.6}As$ cladding layer 4 is uniformly grown, so that the active layer 5 can be formed with a flat surface and a uniform thickness on the said cladding layer 4. Moreover, since current is injected into only the grooves 8 that reach the p-GaAs substrate 1, laser oscillation is carried out in the portion of the active layer 5 that is positioned only over the mesa 1a of the substrate 1.

FIGS. 7A to 7D show another production process of the semiconductor laser array device shown in FIG. 1, by which the production of the laser array device can be simplified. The steps shown in FIGS. 7A, 7C and 7D, respectively, correspond to those of FIGS. 6A, 6E and 6F.

As shown in FIG. 7B, on the p-GaAs substrate 1 with the mesa 1a, the n-GaAs first current blocking layer 10 is formed by LPE, under conditions where the top surface of the first current blocking layer 10 is made flat, in such a manner that it has a thickness of 0.2 μm on the mesa 1a and a thickness of 1.5 μm on the other area. Then, on the first current blocking layer 10, the n-$Al_{0.1}Ga_{0.9}As$ second current blocking layer 2 with a thickness of 0.6 μm and the n-GaAs protective layer 3 with a thickness of 0.1 μm are successively formed by LPE. By this way, the total thickness W of the crystals from the first current blocking layer 10 to the protective layer 3 that are positioned on the mesa 1a becomes 0.9 μm, and accordingly, the groove 8 with a thickness of 1.0 μm are formed so that they can reach the substrate 1. As mentioned above, the steps shown in FIGS. 6B to 6D can be replaced by the step shown in FIG. 7B, which simplifies the production process as a whole, resulting in a laser array device with a high yield.

Example 2

FIG. 2 shows another semiconductor laser array device of this invention in which a buried structure is used as a means for preventing the injection of current into the grooves 8 that are positioned on both side areas of the substrate 1. This semiconductor laser array device is produced as follows: The portions from the n-type contact layer 7 to the n-type second current blocking layer 2 that are positioned on both side areas of the substrate 1 are removed. Both side areas of the substrate 1 are also removed with a certain depth. Then, the remaining areas on both sides of the substrate 1 are filled with an n-AlGaAs first burying layer 20a, a p-AlGaAs second burying layer 20b, and a p-GaAs third burying layer 20c in that order.

Instead of the burying layers 20a, 20b and 20c, a high-mesa structure can be also used.

Example 3

Figure 3:
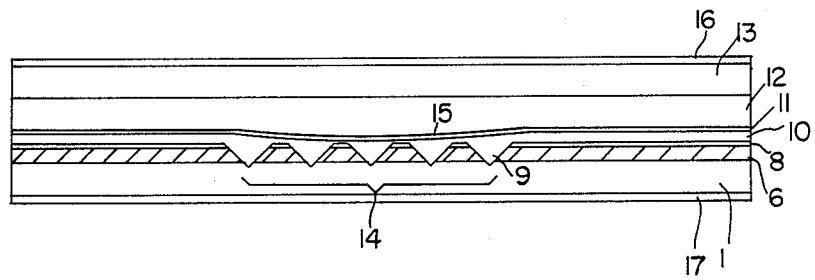
FIG. 3 is a sectional view showing another semiconductor laser array device of this invention.

FIG. 3 shows another semiconductor laser array device of this invention, in which a ridge guide structure is used as a means for preventing the injection of current into the grooves that are positioned on both side areas of the substrate 1. This semiconductor laser array device is produced as follows: The portions of the n-type contact layer 7 positioned over both side areas of the substrate 1 are removed. Then, the portions of the n-type cladding layer 6 positioned over both side areas of the substrate 1 are also removed to a certain depth. An insulating film 30 of $SiO_2$, $Si_3N_4$ or the like is formed on the exposed portions of the contact layer 7 and the cladding layer 6.

Instead of the insulating film 30, the remaining portions positioned over both side areas of the substrate may be filled with a p-AlGaAs burying layer.

Example 4

FIG. 4 shows another semiconductor laser array device of this invention, in which a proton-injected structure (i.e., a high-resistive structure) is used as a means for preventing the injection of current into the grooves that are positioned over both side areas of the substrate 1. Protons are injected into the n-type cladding layer 6 through the n-type contact layer 7, resulting in a proton-injected layer 40 with semi-insulating characteristics. Boron or iodine can be also used as atoms to be injected.

Example 5

FIGS. 5A and 5B show another semiconductor laser array device of this invention, which is produced as follows: On an n-GaAs substrate 11, an n-$Al_xGa_{1-x}$As cladding layer 12 with a thickness 15.μm, an $Al_yGa_{1-y}$As active layer 13 with a thickness of 0.08 μm, a p-$Al_xGa_{1-x}$As first cladding layer 14 with a thickness of 0.2 μm, and an n- or p-GaAs light absorbing layer 15 with a thickness of 0.6 μm are successively formed by molecular beam epitaxy, organic metal-vapor phase epitaxy, or the like, wherein x<y. Then, a plurality of grooves 18 with a width of 5 μm and a pitch of 6 μm are formed in the entire area of the light absorbing layer 15 by a photolithographic technique and an etching technique in such a manner that the grooves 18 have a symmetrically branching structure as shown in FIG. 5B. The etching process for the formation of the grooves 18 are carried out using an etchant containing ammonia and they reach the first cladding layer 14 through the light absorbing layer 15.

Then, on both the light absorbing layer 15 and the first cladding layer 14, a p-$Al_yGa_{1-y}$As second cladding layer 16 and an n-GaAs contact layer 17 are successively formed by organic metal-vapor phase epitaxy, so that the grooves 18 are filled with the second cladding layer 16. Then, zinc is diffused into the center area of the grown layers including the contact layer 17, the second cladding layer 16 and the light absorbing layer 15 at 900° C. for two hours in which a $SiO_2$ film is used as a mask, resulting in a p-type zinc diffusiion area 50. Since the zinc diffusion area 50 is of a p-type, current is injected only into the said area 50.

The waveguides in the light emitting area of this laser array device are equivalent to each other. Each of the waveguides is symmetrical with regard to the imaginable axis thereof, so that the propagation coefficients of laser beams passing through the waveguides become equal to each other, whereby synchronous laser oscillation can be attained. So long as the zinc diffusion area 50 acts to define the area into which current is injected, the depth of the said diffusion area 50 is not limited to a fixed value.

Current blocking structures other than those disclosed in Examples 1–5 can be used by which the same effects as metioned above are attained. Moreover, this invention is applicable to laser array devices in which the polarity type of the current blocking layer is the same as that of the cladding layer positioned in the vicinity of the said current blocking layer, and is also applicable to laser array devices in which the polarity types of all lasers are different from those of the layers of the above-mentioned examples. Moreover, this invention is, of course, applicable to laser array devices of the -InGaAsP/InP system or the like.

Example 6

FIGS. 8A and 8B show another semiconductor laser array device of this invention, which is produced as follows: On a p-GaAs substrate 101, an n-GaAs (or an n-GaAlAs or an n-GaAs/GaAlAs multi-layered structure) current blocking layer 102 with a thickness of 1 μm is formed by LPE. Then, as shown in FIG. 8B, a plurality of striped grooves 103 with a width of 4 μm are formed with a pitch of 5 μm in the substrate 101 by a photolithographic technique and an etching technique in a manner to reach the substrate 101 through the current blocking layer 102, resulting in optical waveguides. The central group 104 of the grooves 103 functions as a light emitting area of the semiconductor laser array device and the other groups 105 of the grooves 103 that are positioned at a distance of 6 μm from both sides of the central group 104 function to make the active layer of the semiconductor laser array device flat and uniform. The shape and the pitch of the grooves 105 are not necessarily the same as those of the grooves 104.

Then, on the current blocking layer 102 including the grooves 103, a p-$Ga_{1-x}Al_x$As cladding layer 106 having a thickness of 0.2 μm on the area outside of the grooves 103, a p- (or n-) $Ga_{1-y}Al_y$As (or a GaAs/GaAlAs quantum well structure) active layer 107 with a thickness of 0.08 μm, an n-Ga$_{1-x}$Al$_x$As cladding layer 108 with a thickness of 1 μm, and an n$^+$-GaAs cap layer 109 with a thickness of 2 μm are successively formed by LPE, resulting in a double-heterostructure multi-layered crystal for laser-oscillating operation (wherein $0 \leq y > x > 1$). Since there are the grooves 105 at a distance of 6 μm from both sides of the light emitting area (i.e., the semiconductor laser array portion) 104, a uniform diffusion of As of the Ga source material solution arises, which makes the active layer 107 flat and uniform at and in the vicinity of the laser array portion 104 when the active layer 107 is grown on the n-type cladding layer 106.

Then, a resist film (not shown) is formed as a protective film on the laser array portion 104 by photolithography, and protons are injected into the area other than the laser array portion 104 by the ion injection method, resulting in a high-resistive area that is positioned outside of the laser array portion 104. As a result, current flows in the laser array portion 104, and any optical-coupling between the adjacent waveguides is not attained in the area on both sides of the said laser array portion 104 and moreover the injection of current into the area on both sides of the said laser array portion 104 is prevented.

Then, a p-sided electrode 100 and an n-sided electrode 111 are formed on the back face of the substrate 101 and the upper face of the cap layer 109, respectively, the wafer is cleaved at right angles to the grooves 103 so as to have a cavity length of 200-300 μm. Then, the cleaved faces are coated with a reflecting film made of Al$_2$O$_3$ or amorphous Si by an electron beam vapor deposition method. By changing the thickness of the reflecting film, the reflection index thereof can be set to be in the range of about 2% to 95%. To obtain a high optical output power, an Al$_2$O$_3$ film with a thickness of λ4 (λ is the oscillation wavelength) is formed on the light-emitting cleaved face, resulting in a front facet with a reflection index of about 2%, and a multi-layered film composed of an Al$_2$O$_3$ film and a Si film is formed on the opposite face by the electron beam vapor deposition method, resulting in a rear facet with a reflection index of about 95%.

The resulting semiconductor laser array device of this example exhibited a threshold current of 100 mA and oscillated laser with a double peak far-field pattern in a stabilized synchronous mode up to 200 mW optical output power.

As mentioned above, by the formation of grooves 105 on both sides of the laser array portion 104, a flat and uniform active layer 107 can be made. Moreover, current and light can be effectively confined within the laser array portion 104, so laser oscillation can be attained in a synchronous mode over the entire area of the laser array portion 104.

As a method by which the injected current is confined only within the laser array portion 104, this invention is not, of course, limited to the proton injection method. The waveguiding structure (the central groove structure) of the laser array portion and the groove structure on both sides of the laser array portion are not limited to a parallel striped-structure.

EXAMPLE 7

FIGS. 9A and 9B show another semiconductor laser array device of this invention in which a p-GaAs substrate 123 with a mesa 123a is used so as to confine an injected current within the laser oscillating area of the semiconductor laser array device by the use of a current blocking layer composed of the n-Ga$_{0.9}$Al$_{0.1}$As layer 121 and the n-GaAs layer 122. The waveguiding structure of this semiconductor laser array device is constituted by symmetrically branching waveguides that are created in the active layer corresponding to the symmetrically branching grooves 103 as shown in FIG. 9B.

FIG. 9C shows another waveguiding structure of the above-mentioned semiconductor laser array device that is different from that of FIG. 9B in that the grooves 103 of FIG. 9C positioned on both sides of the laser array portion are designed to be straight from one facet to the other, whereas the grooves 103 of FIG. 9B are curved.

EXAMPLE 8

FIGS. 10A and 10B show another semiconductor laser array device of this invention in which the waveguiding structure is constituted by symmetrically branching waveguides corresponding to the symmetrically branching grooves 103 in such a manner that the symmetrically branching waveguides are smoothly combined in the vicinity of both facets. The current blocking structure (the striped structure) by which current is confined within the light-emitting area of this semiconductor laser array device is formed as follows: The portions of the n-GaAs cap layer 109 and the n-GaAlAs cladding layer 108 that are positioned outside of the light-emitting area are removed by an etching technique, followed by forming an insulating film 131 of SiN of the like thereon.

Another current blocking structure can be formed by the removal of the portions of the n-GaAs cap layer 109, the n-GaAlAs cladding layer 108, the active layer 107, the p-GaAlAs cladding layer 106, and the GaAs substrate 101, by the use of an etching technique, and by the disposition of an insulating film thereon. In this case, the grooves 103 positioned on both sides of the laser array portion are finally removed.

FIG. 10C shows another waveguiding structure that is different from that of FIG. 10B in that the waveguides positioned on both sides of the laser array portion branch as well.

EXAMPLE 9

FIG. 11 shows another semiconductor laser array device of this invention in which a selective diffusion technique is applied to the area of the n-GaAs cap layer 109 other than the light-emitting area by the use of Zn, resulting in a p-GaAs region 141. The p-n junction obtained between the p-GaAs region 141 and the n-cap and cladding layers 109 and 108 gives rise to the confinement of current within the light-emitting area.

EXAMPLE 10

FIGS. 12A and 12B show the production process of another semiconductor laser array device of this invention. A multi-layered crystal structure shown in FIG. 12A is formed by an epitaxial growth technique in the same way as described in the above-mentioned examples. Then, the portions of the multi-layered crystals positioned on both sides of the laser array portion 104 are removed from the cap layer 109 to the substrate 101 by a chemical etching technique. Then, on the remaining portions positioned on both sides of the laser array portion 104, an n-GaAlAs burying layer 151, a high-resistive GaAlAs layer 152, and a p-GaAlAs burying layer 153 are successively formed by a selective epitaxial growth technique, resulting in a current blocking structure. The grooves 105 positioned on both sides of the laser array portion 104 are, as a result, removed.

Although Examples 6–10 disclose the use of an n-type substrate, a p-type substrate can be employed in which the other layers have different polarity types from the above-mentioned polarity types. Moreover, this invention is also applicable to InGaAsP/InP systems.

EXAMPLE 11

FIGS. 13A to 13C shows the production process of another semiconductor laser device of this invention. On a p-GaAs substrate 201, an n-$Al_{0.1}Ga_{0.9}As$ first current blocking layer 202 with a thickness of 0.7 $\mu$m and an n-GaAs protective layer 203 with a thickness of 0.1 $\mu$m are successively formed (FIG. 13A). Then, a plurality of grooves 220 with a width of 4 $\mu$m, a depth of 1.0 $\mu$m and a pitch of 5 $\mu$m are formed in a manner to reach the substrate 201 through the first current blocking layer 202 by a photolithographic technique and an etching technique. The grooves 220 form a laser array portion of the semiconductor laser device. Grooves 221 are formed at an angle of 10° or more to the waveguiding direction of laser beams (i.e., the direction of the grooves 220). When each groove 220 is positioned in the space between the adjacent mesas, each groove 221 that is formed in the space between the adjacent reversed-type mesas is disposed at right angles to the groove 220 (FIG. 13B).

Then, in the same way as described in the above-mentioned examples, on the protective layer 203 including the grooves 220 and 221, a p-$Al_{0.4}Ga_{0.6}As$ cladding layer 204 having a thickness of 0.25 $\mu$m outside of the grooves, an $Al_{0.1}Ga_{0.9}As$ active layer 205 with a thickness of 0.08 $\mu$m, an n-$Al_{0.4}Ga_{0.6}As$ cladding layer 206 with a thickness of 1.2 $\mu$m, and an n-GaAs contact layer 207 with a thickness of 1.5 $\mu$m are successively formed by LPE (FIG. 13C). Since the current blocking layer 202 is made of $Al_{0.1}Ga_{0.9}As$, it does not undergo meltback during the LPE growth process. Moreover, since the grooves 220 and 221 exist over the entire area of the substrate 201, the p-type cladding layer 204 is uniformly grown, which makes the active layer 205 flat and uniform. The active layer 205 is neither curved nor discontinued.

Then, the portions of the n-GaAs layer 207 and the n-AlGaAs cladding layer 206 that are positioned over the grooves 221 are removed by an etching technique, followed by coating there with an insulating film 230 made of $SiO_2$, $Si_3N_4$ or the like, resulting in a ridge guide structure (FIG. 13C) by which current is confined within the active layer 205 corresponding to the laser array portion.

In the above-mentioned semiconductor laser array device, since the direction of the grooves 221 is different from that of the grooves 220 forming the laser array portion, laser beams generating from the waveguides that are created in the active layer 205 corresponding to the grooves 221 attain a suppressed reflection at the facets, which makes laser oscillation difficult from the said waveguides.

Example 12

FIG. 14A shows another semiconductor laser array device of this invention, which is the same structure as that of Example 11 except that the laser array device of FIG. 14A uses a buried structure for the confinement of current, instead of the ridge guide structure of FIG. 13C. The portions from the contact layer 207 to the substrate 201 that are positioned on both sides of the laser array portion (i.e., over the grooves 221) are removed by an etching technique. On the remaining portions positioned on both sides of the laser array portion, an n-AlGaAs first burying layer 241, a p-AlGaAs second burying layer 242, and a p-GaAs third burying layer 243 are successively formed by an epitaxial growth technique.

Example 13

FIG. 14B shows another semiconductor laser array device of this invention, which is the same structure as that of Example 11 except that the laser array device of FIG. 14B uses a proton injected structure for the confinement of current, instead of the ridge guide structure of FIG. 13C, in which protons are injected into the areas 250 that are positioned on both sides of the laser array portion, resulting in areas with semi-insulating characteristics.

Example 14

FIG. 14C shows another semiconductor laser array device of this invention, in which by the use of a ridged substrate, current is injected only into the grooves positioned in the central area of the substrate. This laser array device is produced as follows: A mesa 290 is formed on a substrate 201 by an etching technique. An n-GaAs first current blocking layer 260 is formed on the substrate 201, and the first current blocking layer 260 is etched so that the top surface of the first current blocking layer 260 becomes flush with the top surface of the mesa 290 of the substrate 201 in the same way as described in Example 1. Then, in the same way as described in Example 11, an n-$Al_{0.1}Ga_{0.9}As$ second current blocking layer 202 and an n-GaAs protective layer 203 are successively formed on both the substrate 201 and the first current blocking layer 260. Then, grooves 220 are formed in such a manner that they reach the substrate 201 through the second current blocking layer 202. Grooves 221 are also formed in the same way, but they do not reach the substrate due to the first current blocking layer 260. Thereafter, layers 204 to 207 are successively formed on the protective layer 203 including the grooves 220 and 221 in the same way as described in Example 11, resulting in a semiconductor laser array device in which current is injected only into the area corresponding to the grooves 220 in the mesa 290 of the substrate 201. Accordingly, the light emission of this laser array device is carried out in the area positioned over the mesa 290 of the substrate 201.

This invention is, of course, applicable to other current-confining structures by which the same affects as mentioned above can be attained.

Example 15

FIGS. 15A–15C, respectively, show other arrangements of grooves of this invention. Grooves 221 are disposed at an angle to the grooves 220 that form the laser array portion of the semiconductor laser array device (FIG. 15A and 15B), so that a uniform and flat active layer can be grown, which allows the semiconductor laser array device to attain laser oscillation in a stabilized mode. Grooves 221 can be also disposed in the two or more directions different from that of the grooves 220 (FIG. 15C).

With regard to Examples 11–15, this invention is most applicable to the following laser array devices:

(1) devices in which the polarity type of each of the current blocking layer 202 and the protective layer 203 is different from that of the above-examples;

(2) devices in which the polarity type of each layer is different from that of the above-mentioned examples;

(3) devices in which the polarity type of each layer except for the current blocking layer 202 and the protective layer 203 is different from that of the above-mentioned examples;

(4) devices in which the grooves partly include symmetrically branching grooves; and (5) devices in which crystal layers other than a crystal layer for filling the grooves therewith are grown by crystal growth techniques other than LPE.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising a substrate with a plurality of first grooves with a given pitch, and a current blocking layer with a conductivity type that is different from that of said substrate and that is disposed on the groove-side surface of said substrate, an improved structure wherein:

said current blocking layer has a plurality of second grooves on its crystal growth surface that is opposite to the groove-side surface of said substrate;

a heterostructure multi-layered crystal is disposed on said current blocking layer, said multi-layered crystal having an active layer for laser oscillation; and the position of each of the first grooves is shifted half a pitch from that of each of the second grooves in a central area elongated substantially along the laser oscillation direction, and wherein each of the first grooves is positioned over each of the second grooves in side areas, said second grooves reaching said substrate through said current blocking layer in said central area, which results in current paths.

2. A semiconductor laser array device according to claim 1, wherein the position of each of the first grooves in said central area is shifted half a pitch from that of each of the first grooves in said side areas.

3. A semiconductor laser array device according to claim 1, wherein the position of each of the second grooves in said central area is shifted half a pitch from that of each of the second grooves in said side areas.

* * * * *